United States Patent
Park et al.

(10) Patent No.: US 8,432,020 B2
(45) Date of Patent: Apr. 30, 2013

(54) CAPACITORS, SYSTEMS, AND METHODS

(75) Inventors: Chanro Park, Austin, TX (US); Sangduk Park, Hwaseong-si (KR); Paul D. Kirsch, Austin, TX (US); David Gilmer, Austin, TX (US); Chang Yong Kang, Austin, TX (US); Joel Barnett, Austin, TX (US)

(73) Assignee: Sematech, Inc., Austin, TX (US)

( * ) Notice: Subject to any disclaimer, the term of this patent is extended or adjusted under 35 U.S.C. 154(b) by 208 days.

(21) Appl. No.: 12/794,251

(22) Filed: Jun. 4, 2010

(65) Prior Publication Data

US 2011/0298090 A1 Dec. 8, 2011

(51) Int. Cl.
*H01L 29/92* (2006.01)
*H01L 21/02* (2006.01)

(52) U.S. Cl.
USPC ............ 257/532; 257/E29.343; 257/E21.008; 438/393

(58) Field of Classification Search .................. 257/532, 257/E29.343, E21.008; 438/393
See application file for complete search history.

(56) References Cited

U.S. PATENT DOCUMENTS

| | | | |
|---|---|---|---|
| 7,407,897 B2 | 8/2008 | Won et al. | 438/240 |
| 7,791,192 B1 * | 9/2010 | Joshi et al. | 257/724 |
| 2004/0061157 A1 * | 4/2004 | Kiyotoshi et al. | 257/296 |
| 2006/0017136 A1 * | 1/2006 | Won et al. | 257/532 |

OTHER PUBLICATIONS

Babcock et al., "Analog characteristics of metal-insulator-metal capacitors using PECVD nitride dielectrics," *IEEE Electron Device Lett.*, 22(5): 230-232, 2001.
Ding et al., "Atomic-layer-deposited $Al_2O_3$-$HfO_2$ laminated and sandwiched dielectrics for metal-insulator-metal capacitors," *J. Phys. D: Appl Phys.*, 40: 1072-1076, 2007.
Durand et al., "Electrical property improvements of yttrium oxide-based metal-insulator-metal capacitors," *J. Vac. Sci. Technol. A.*, 24:459-466, 2006.
Hu et al., "A high performance MIM capacitor using $HfO_2$ dielectrics," *IEEE Electron Device Lett.*, 23(9): 514-516, 2002.
Hu et al., "High Performance ALD $HfO_2$-$Al_2O_3$ Laminate MIM Capacitors for RF and Mixed Signal IC Applications," *Proc. of IEDM*, 379-383, 2003.
Hu et al., "MIM capacitors using atomic-layer-deposited high-κ $(HfO_2)_{1-x}(Al_2O_3)_x$ dielectrics," *IEEE Electron Device Lett.*, 24(2):60-62, 2003.
Jeannot et al., "Toward next high performances MIM generation: up to 30fF/μm2 with 3D architecture and high-κ materials," *Proc. of IEDM*, 997-1000, 2007.

(Continued)

*Primary Examiner* — Victor A Mandala
*Assistant Examiner* — Whitney T Moore
(74) *Attorney, Agent, or Firm* — Fulbright & Jaworski L.L.P.

(57) ABSTRACT

Capacitors, systems, and methods are disclosed. In one embodiment, the capacitor includes a first electrode. The capacitor may also include a first insulator layer having a positive VCC adjacent to the first electrode. The capacitor may further include a second insulator layer having a negative VCC adjacent to the first insulator layer. The capacitor may also include a third insulator layer having a positive VCC adjacent to the second insulator layer. The capacitor may also include a second electrode adjacent to the third insulator layer.

20 Claims, 4 Drawing Sheets

OTHER PUBLICATIONS

Jeong et al., "High quality high-κ MIM capacitor by $Ta_2O_5/HfO_2/Ta_2O_5$ multi-layered dielectric and $NH_3$ plasma interface treatments for mixed-signal/RF applications," *2004 Symposium on VLSI Technology Digest of Technical Papers*, 222-223, 2004.

Kim et al., "$HfO_2$ and Lanthanide-doped $HfO_2$ MIM Capacitors for RF/Mixed IC Applications," *2003 Symposium on VLSI Technology Digest of Technical Papers*, 77-78, 2003.

Kim et al., "High-Capacitance Metal-Insulator-Metal Capacitors Using Amorphous $Sm_2Ti_2O_7$ Thin Film," *J. Electrochem Soc.*, 154: G220-G223, 2007.

Kim et al., "Improvement of voltage linearity in high-κ MIM capacitors using $HfO_2$-$SiO_2$ stacked dielectric," *IEEE Electron Device Lett.*, 25 (8):538-540, 2004.

Kim et al., "$BaSm_2Ti_4O_{12}$ Thin Film for High-Performance Metal-Insulator-Metal Capacitors," *IEEE Electron Device Lett.*, 27(9), 740-742, 2006.

Lim et al., "Metal-insulator-metal capacitors using $Ba_2Ti_9O_{20}$ dielectric thin film," *J. Euro Ceram. Soc.*, 27:2871-2874, 2007.

Mikhelashvili et al., "High capacitance density metal-insulator-metal structure based on $Al_2O_3$—HfTiO nanolaminate stacks," *Appl. Phys Lett.*, 90:013506, 2007.

Park et al., "Mass Production Worthy MIM Capacitor on Gate polysilicon(MIM-COG) Structure using $HfO_2/HfO_xC_yN_z/HfO_2$ Dielectric for Analog/RF/Mixed Signal Application," *Proc. of IEDM*, 993-996, 2007.

Thomas et al., "Reliable 3D damascene MIM architecture embedded into Cu interconnect for a $Ta_2O_5$ capacitor record density of 17 $fF/\mu m^2$," *2007 Symposium on VLSI Technology Digest of Technical Papers*, 58-59, 2007.

Yang et al., "High-Density RF MIM Capacitors Using High-κ $La_2O_3$ Dielectrics," *J. Electrochem. Soc.*, 151:F162-F165, 2004.

Yu et al., "A high-density MIM capacitor (13 $fF/\mu m^2$) using ALD $HfO_2$ dielectrics," *IEEE Electron Device Lett.*, 24(2):63-65, 2003.

\* cited by examiner

CAPACITORS, SYSTEMS, AND METHODS

BACKGROUND OF THE INVENTION

1. Field of the Invention

This invention relates to semiconductors and more particularly, but not by way of limitation, relates to capacitors, as well as systems and methods for making and using capacitors.

2. Description of the Related Art

Capacitors may be used in certain electrical devices. For example, the metal-insulator-metal (MIM) capacitor is one component that may be used in certain semiconductor devices. MIM capacitors are also found in some integrated circuits, including analog and mixed signal integrated circuits, and are one of the main components in radio frequency devices. The MIM capacitors can be used for decoupling, filtering, oscillating, and other tasks within these devices.

Semiconductor capacitors may include an electrode layer, and insulator layer, and a second electrode layer. The insulator layer may be characterized as a dielectric layer. In the field of semiconductor device fabrication, progress is commonly gauged by a reduction in the size of semiconductor components. Unfortunately, reduction in the size of a capacitor also reduces its capacitance and increases leakage current density through the electrodes. Multiple dielectric layers are used in some semiconductor capacitors to combat this problem. For example, "Capacitor of Analog Semiconductor Device Having Multi-Layer Dielectric Film and Method of Manufacturing the Same" (U.S. Pat. No. 7,407,897) discloses a capacitor with a multi-layer dielectric film that includes a first interlayer insulator on a semiconductor substrate, lower electrode on the first interlayer insulator, a lower dielectric film having a negative quadratic voltage coefficient of capacitance, a intermediate dielectric film a positive voltage coefficient of capacitance on the lower dielectric film, an upper dielectric film having a negative quadratic voltage coefficient of capacitance on the intermediate dielectric film, and an upper electrode on the upper dielectric film.

SUMMARY OF THE INVENTION

Integrated Circuit (IC) devices are presented. In one embodiment, an IC device may include a chip package configured to house an IC. The IC device may include a plurality of electrical interface pins coupled to the chip package and in communication with the IC. The electrical interface pins may be configured to conduct electrical signals. The IC device may further include an IC disposed within the chip package. The IC may have at least one capacitor. The capacitor may include a first electrode. The capacitor may further include a first insulator layer having a positive quadratic voltage coefficient of capacitance (the "quadratic voltage coefficient of capacitance" is referred to as VCC) adjacent to the first electrode. The capacitor may also include a second insulator layer having a negative VCC adjacent to the first insulator layer. The capacitor may also include a third insulator layer having a positive VCC adjacent to the second insulator layer. The capacitor may further include a second electrode adjacent to the third insulator layer.

In certain embodiments, the capacitor's first insulator layer may include a high-k material. In a further embodiment, the capacitor's third insulator layer may include a high-k material. In further embodiments of the IC device, the capacitor's second insulator layer may include silicon dioxide ($SiO_2$).

In certain embodiments of the IC device, the capacitor's first insulator layer, the second insulator layer, and the third insulator layer may be configured to decrease the effective oxide thickness (EOT) of the capacitor. In further embodiments, the capacitor's first insulator layer and the third insulator layer may be configured to reduce the leakage current measured through the first electrode and the second electrode.

In certain embodiments of the IC device, the capacitor's first insulator layer and the third insulator layer may be configured to reduce the capacitance voltage nonlinearity of the capacitor.

In further embodiments of the IC device, the capacitor's first electrode layer and the second electrode layer may include TiN, TaN, Ti, Ta, Ru, RuO2, TiSiN, W, WN, Ir, IrO2, Al, or a mixture including two or more these metals.

Apparatuses are also presented. In one embodiment, an apparatus may include a first electrode. The apparatus may also include a first insulator layer having a positive VCC adjacent to the first electrode. The apparatus may further include a second insulator layer having a negative VCC adjacent to the first insulator layer. The apparatus may also include a third insulator layer having a positive VCC adjacent to the second insulator layer. The apparatus may also include a second electrode adjacent to the third insulator layer.

In certain embodiments of the apparatus, the first insulator layer may include a high-k material. In further embodiments, the third insulator layer may include a high-k material. In further embodiments, the second insulator layer may include $SiO_2$.

In a further embodiment of the apparatus, the first insulator layer and the third insulator layer may be configured to decrease the EOT of the apparatus. In one embodiment, the first insulator layer, the third insulator layer, and the third insulator layer may be configured to reduce the leakage current measured through the first electrode and the second electrode. In certain embodiments, the first insulator layer and the third insulator layer may be configured to reduce capacitance voltage nonlinearity.

In certain embodiments, the first electrode layer and the second electrode layer may include TiN, TaN, Ti, Ta, Ru, RuO2, TiSiN, W, WN, Ir, IrO2, Al, or a mixture including two or more these metals.

Methods of manufacturing are also presented. In one embodiment, a method may include forming a first electrode. Additionally the method may include forming a first insulator layer having a positive VCC adjacent to the first electrode. The method may also include forming a second insulator layer having a negative VCC adjacent to the first insulator layer. The method may further include forming third insulator layer having a positive VCC adjacent to the second insulator layer. The method additionally includes forming a second electrode adjacent to the third insulator layer.

In a further embodiment of the method, forming the first insulator layer may include forming a high-k material. In an additional embodiment, forming the third insulator layer may also include forming a high-k material.

In an additional embodiment, forming the second insulator layer may also include forming a $SiO_2$ layer.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the disclosed IC device, apparatus, and method. The IC device, apparatus, and method may be better understood by reference to one or more of these drawings in combination with the detailed description of specific embodiments presented herein.

DETAILED DESCRIPTION

Figure 1:
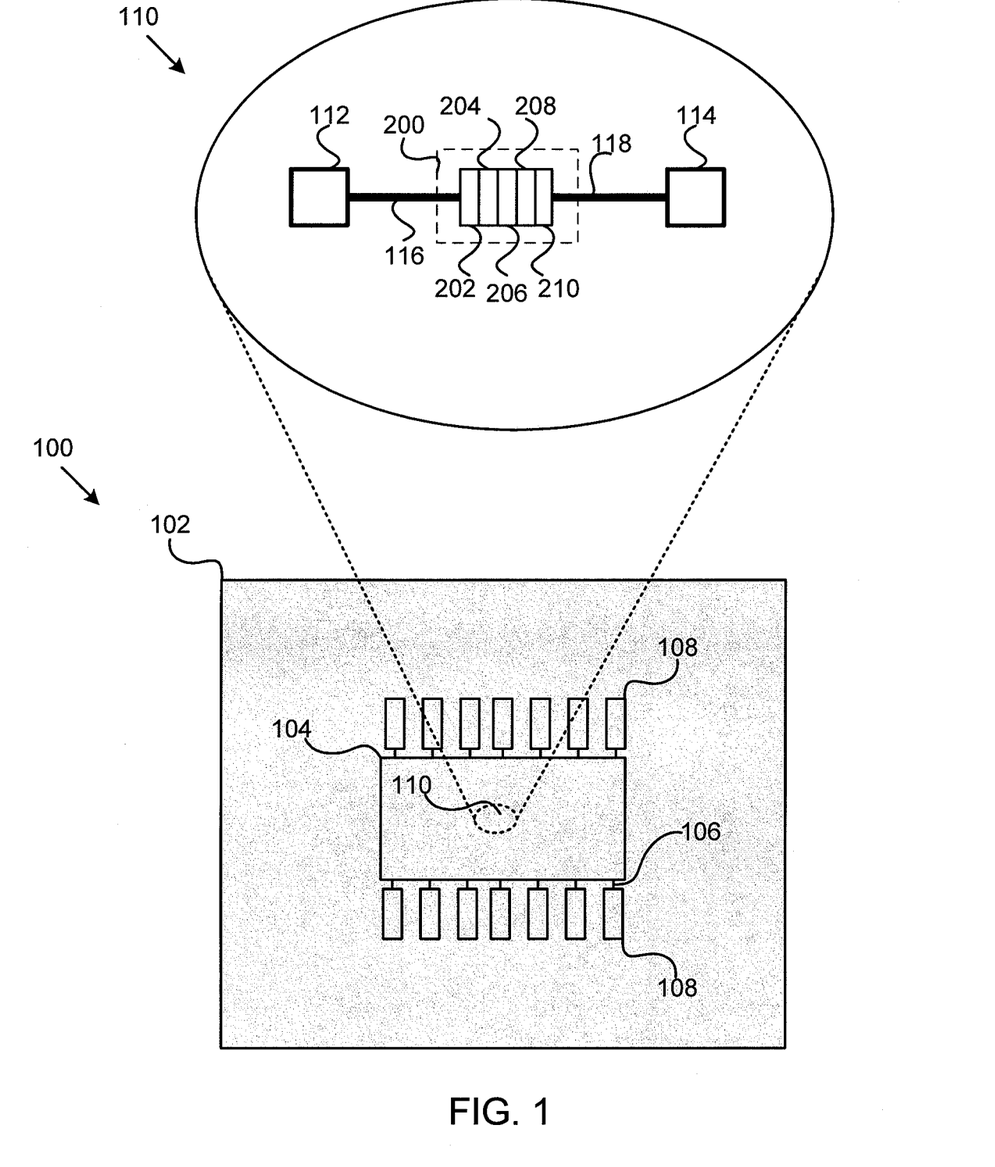
FIG. 1 is a schematic top view and detailed view illustrating one embodiment of an IC device with a capacitor.

FIG. 1 illustrates one embodiment of an IC device 100. In the depicted embodiment, the IC device may include a chip package 104. The chip package 104 may include an IC 110, one or more electrical interface pins 106, and one or more pads 108. A portion of the IC 110 is described in further detail. In the detailed illustration view, the IC 110 may include, among other things, one or more capacitors 200, such as an embodiment of apparatus described in FIG. 2. Various embodiments of capacitors 200 are described below.

In various other embodiments of the IC 110, the transistors may be coupled directly to other transistors, or other components of the IC 110 through metal layers or connections (e.g., pads 112, 114). Indeed, certain ICs 110 may include multiple layers, wherein a capacitors 200 is connected through vias between the layers (not shown). The IC 110 may comprise one or more transistors, a memory device, a processing device, a Radio Frequency (RF) device, a control device. The IC 110 may be implemented as at least a portion of a Field Programmable Gate Array (FPGA), an Application Specific Integrated Circuit (ASIC), a Programmable Logic Device (PLD), or the like. Although several embodiments of an IC 110 have been listed for illustrative purposes, one of ordinary skill in the art will recognize that this is not an exhaustive list of possible ICs 110.

In a further embodiment, the chip package 104 may be coupled to a circuit card 102 by one or more contact pads 108 or other means for electrical communication. For example, a computer motherboard may include a plurality of chip packages 104 containing ICs 110 according to the present embodiments. In one embodiment, the chip package 104 may house an IC 110 comprising a computer processor, or the like. Alternatively, certain wireless communication devices may include one or more circuit cards 102 for wireless communication, which may include one or more chip packages 104 in a set of communication chip packages 104. One of ordinary skill in the art of IC manufacture and design will recognize various alternative implementations of a circuit card 102 which are configurable to use the IC 110 and capacitors 200 of the present embodiments. Such chip packages 104 may include ICs 110 that contain one or more capacitors 200 as described below.

Figure 2:
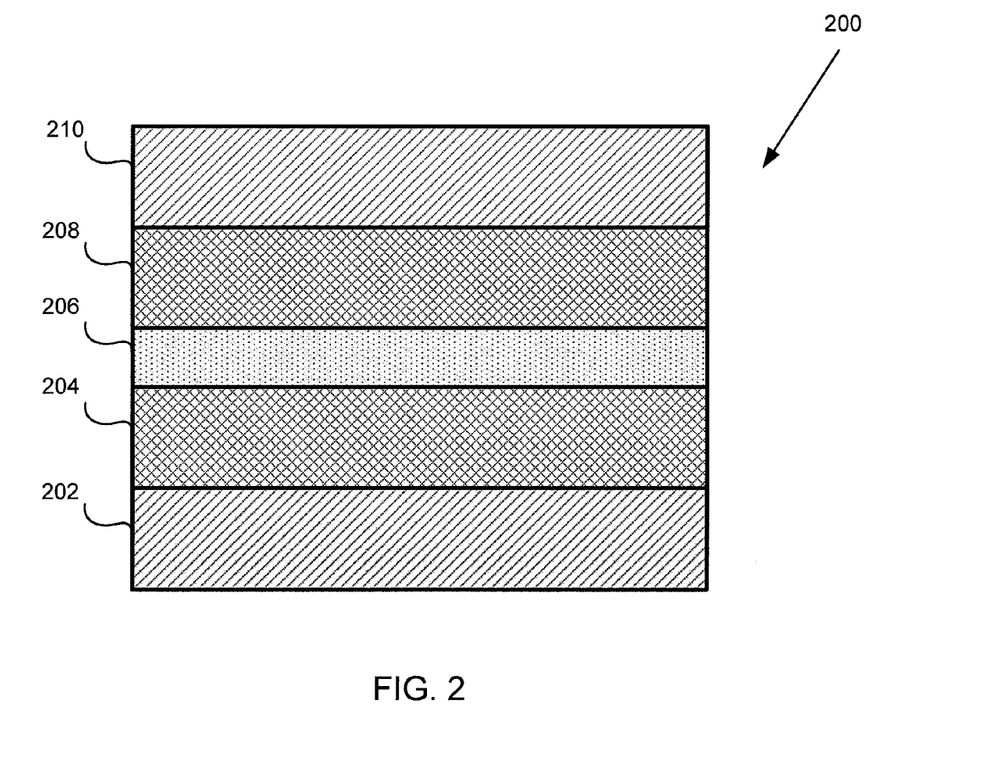
FIG. 2 is a schematic cross-section diagram illustrating one embodiment of a capacitor.

FIG. 2 illustrates one embodiment of an apparatus comprising the capacitor 200. In one embodiment, the capacitor 200 may include a first electrode 202. In one embodiment, the first electrode 202 may be coupled to an IC 110 through one or more conduction lines 116 and/or pads 112. The first electrode 202 may conduct electrical currents from one or more conduction lines 116 on the IC 110. The first electrode 202 may be configured as an anode. Alternatively, the first electrode 202 may be configured as a cathode. The first electrode 202 may be made from any suitable material or combination of materials. For example, in an embodiment, it may include TiN. Alternatively, TaN or other similar materials may be used to manufacture or fabricate the first electrode 202. One of ordinary skill in the art may recognize other potential several other metals compatible for IC fabrication including Ti, Ta, TiSiN, W, Cu, Ru, $RuO_2$, Al, Al—Cu, etc.

The capacitor 200 may also include a first insulator layer 204 having a positive VCC adjacent to the first electrode 202. The capacitance of the capacitor 200 may change as the bias voltage is varied. For example, the relationship between the capacitance and the bias voltage of the capacitor 200 may be described as the capacitance voltage non-linearity and may be characterized by the following equation:

$$\frac{\Delta C}{C_0} = \frac{C(V) - C_0}{C_0} \alpha V^2 + \beta V \qquad (1)$$

where C is the capacitance of the material, V is the voltage applied, $C_0$ is the capacitance at zero-bias, and $\alpha$ is the quadratic voltage coefficient of capacitance (VCC) and $\beta$ is the linear voltage coefficient of capacitance. The first insulator layer 204 may be made from any suitable material or combination of materials having a positive VCC. In certain embodiments, the first insulator layer 204 may be in direct contact with the first electrode 202.

In certain embodiments, the first insulator layer 204 may include a high-k material. The term high-k means that the dielectric constant (k) may be high relative to other typical dielectric materials. The high-k material may include a material with higher dielectric constant than typical gate dielectric materials, which may enable the high-k material to be thicker than conventional dielectric layers while maintaining a similar level of capacitance. In one embodiment, the first insulator layer 204 may include zirconium diozide ($ZrO_2$), a high-k material with a dielectric constant higher than $SiO_2$. For example, the dielectric constant of one preparation of $ZrO_2$ is estimated to be 39, and the dielectric constant of one preparation of $SiO_2$ is estimated to be 3.9. Other high-k materials that may be used in embodiments of this invention include, hafnium oxide ($HfO_2$), hafnium silicate ($HfSiO_x$), and zirconium ortho-silicate ($ZrSiO_2$). One of ordinary skill in the art may recognize other potential high-k materials suitable for forming the first insulator layer 204.

The capacitor 200 may also include a second insulator layer 206 having a negative VCC adjacent to the first insulator layer 204. The second insulator layer 206 may be made from any suitable material or combination of materials. In certain embodiments, the second insulator 206 may be any dielectric material. For example, the second insulator 206 may include $SiO_2$. In certain embodiments, the second insulator layer may be in direct contact with first insulator layer.

The capacitor 200 may also include a third insulator layer 208 having a positive VCC adjacent to the second insulator layer. The third insulator layer 208 can be made from any suitable material or combination of materials having a positive VCC. In one embodiment, the material of combination of materials used for the third insulator layer 208 may be the same as the material or combination of materials used for the first insulator layer 204. In another embodiment, the first insulator layer 204 and the third insulator layer 208 may include different materials. In some embodiments, the third-insulator layer 208 is in direct contact with the second insulator layer 206.

In one embodiment, the third insulator layer 208 may be a high-k material. In certain embodiments these high-k materials may include $HfO_2$, $HfSiO_x$, and $ZrSiO_2$. One of ordinary skill in the art may recognize other potential high-k materials suitable for forming the third insulator layer 208.

The capacitor 200 may also include a second electrode 210 adjacent to the third insulator layer 208. In one embodiment, the second electrode 210 may be coupled to an IC 110 through one or more conduction lines 118 and/or pads 114. The second electrode 210 may conduct electrical currents from one or more conduction lines 116 on the IC 110. The second electrode 210 may be configured as an anode. Alternatively, the second electrode 212 may be configured as a cathode. The second electrode 202 can be made from any suitable material or combination of materials. For example, in an embodiment, it may include TiN. Alternatively, TaN or other similar materials may be used. In an embodiment, the third electrode 210 and the first 202 may be made of the same material or materials. In another embodiment, the third electrode 210 and the first electrode 202 may be made of different materials or combination of materials.

In one embodiment of capacitor 200, the first insulator layer 204 and the third insulator layer 208 may be configured to decrease the effective oxide thickness (EOT) of the capacitor. The EOT of an insulator layer may be defined as follows:

$$EOT = \tau_{dielectric}\left(\frac{k^{SiO_2}}{k}\right) \quad (2)$$

where the $\tau_{dielectric}$ is the physical thickness of the insulator layer, k is the dielectric constant of the insulator layer, and $k^{SiO2}$ is the dielectric constant of $SiO_2$. The EOT of each of the insulator layers 204-208 in the capacitor 200 may be added together to find the EOT for the capacitor. In Equation 2, the dielectric constant of $SiO_2$ is estimated to be 3.9. Equation 2 demonstrates that increasing the physical thickness of a dielectric layer with a high dielectric constant, such as a high-k layer, may not increase the EOT as much as increasing the physical thickness of a dielectric layer with a low dielectric constant. In certain embodiments, the first insulator layer 204 and the second insulator layer 208 may be high-k materials, and the second insulator layer 206 may include materials like $SiO_2$ that have a low dielectric constant. In certain embodiments, the physical thickness of the first insulator layer 204 and the third insulator layer 208 may be greater than the physical thickness of the second insulator layer 206 to reduce the EOT of the capacitor 200.

In another embodiment of capacitor 200, the first insulator layer 204 and the third insulator layer 208 may be configured to reduce the leakage current measured through the first electrode 202 and the second electrode 210. Leakage current may be defined as the unwanted flow of current through an insulator layer. As an insulator layer or layers of a capacitor become thinner, the amount of leakage current measured may increase. In one embodiment, leakage current could flow from first electrode 202 to second electrode 210. In another embodiment, leakage current could flow from second electrode 210 to first electrode 202. The combined thickness of the first insulator layer 204, the second insulator layer 206, and the third insulator layer 208 may determine the amount of leakage current that could flow between the electrodes 202, 210. The greater the combined thickness, the less leakage current may flow through the capacitor. In one embodiment, the first insulator layer 204 and the third insulator layer 208 are thicker than the second insulator layer 206.

In another embodiment, the first insulator layer 204, the second insulator layer 206, and the third insulator layer 208 are configured to reduce the capacitance voltage nonlinearity of capacitor 200. Improving the capacitance voltage nonlinearity may improve the accuracy of a capacitor. The first insulator layer 204 and the third insulator layer 208, each having a positive VCC, may positively affect the capacitance voltage nonlinearity, meaning that as the applied voltage increases or decreases, the capacitance may increase or decrease, respectively. The second insulator layer 206, having a negative VCC, may negatively affect the capacitance voltage nonlinearity, meaning that as the applied voltage increases or decreases, the capacitance may decrease or increase, respectively. The contribution of each insulator layer within a capacitor on VCC may be expressed by equation (3):

$$\alpha = \sum_i \alpha_i \delta_i^3 \quad (3)$$

where $\alpha$ is the VCC of the capacitor, $\alpha_i$ is the VCC of layer i, and $\delta_i$ is the EOT of layer i divided by the total EOT of the capacitor. In certain embodiments, the capacitance voltage nonlinearity of capacitor 200 is improved when the first insulator layer 204 is in direct contact with the first electrode layer 202. In certain embodiments, the capacitance voltage linearity of capacitor 200 is improved when the third insulator layer 208 is in direct contact with the second electrode 210. In certain embodiments, the capacitance voltage linearity of capacitor 200 is improved when second insulator layer 206 is between the first insulator layer 204 and the third insulator layer 208.

Figure 3:
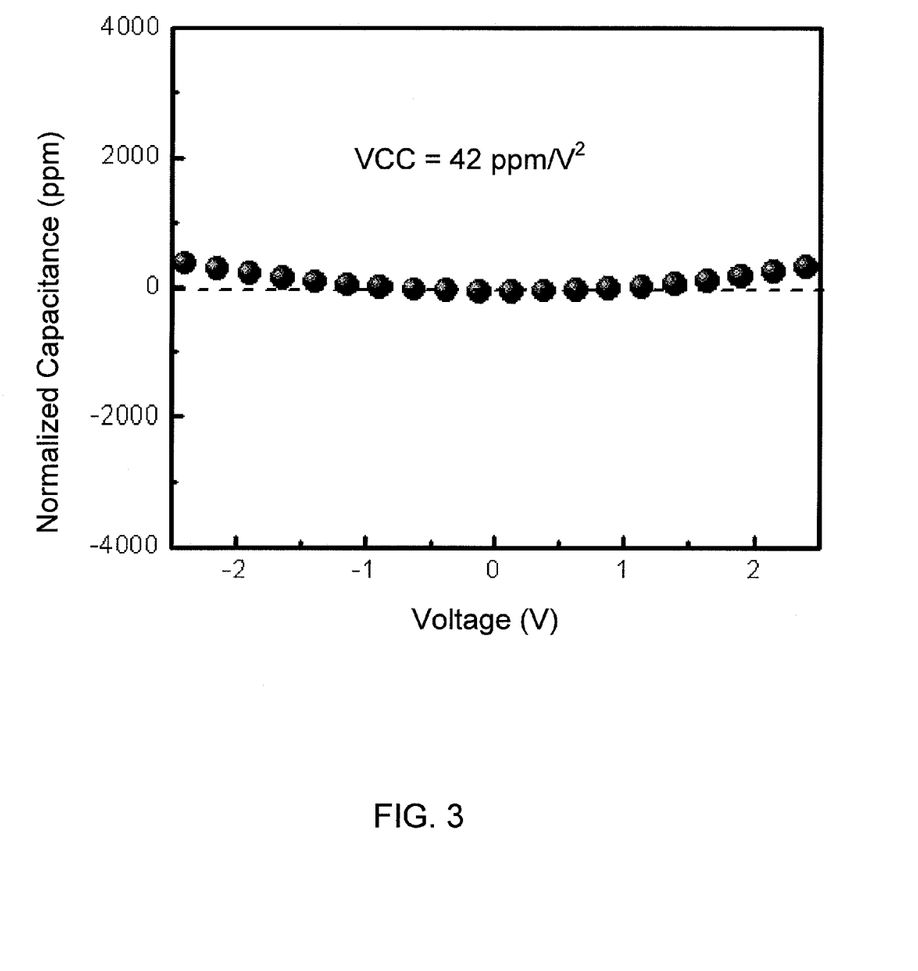
FIG. 3 is a graph illustrating Normalized Capacitance versus voltage for on embodiment of a capacitor.

FIG. 3 illustrates the normalized capacitance versus the voltage for one embodiment of capacitor 200. In this embodiment, the first insulator layer 204 includes 6 nm of $ZrO_2$, the second insulator layer 206 includes 4 nm of $SiO_2$, and the third insulator later layer includes 6 nm of $ZrO_2$. In this example, the capacitance voltage non-linearity of the capacitor 200 may be characterized as flat. Moreover, the normalized capacitance of the capacitor varies little as the voltage across the capacitor is increased or decreased.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 4:
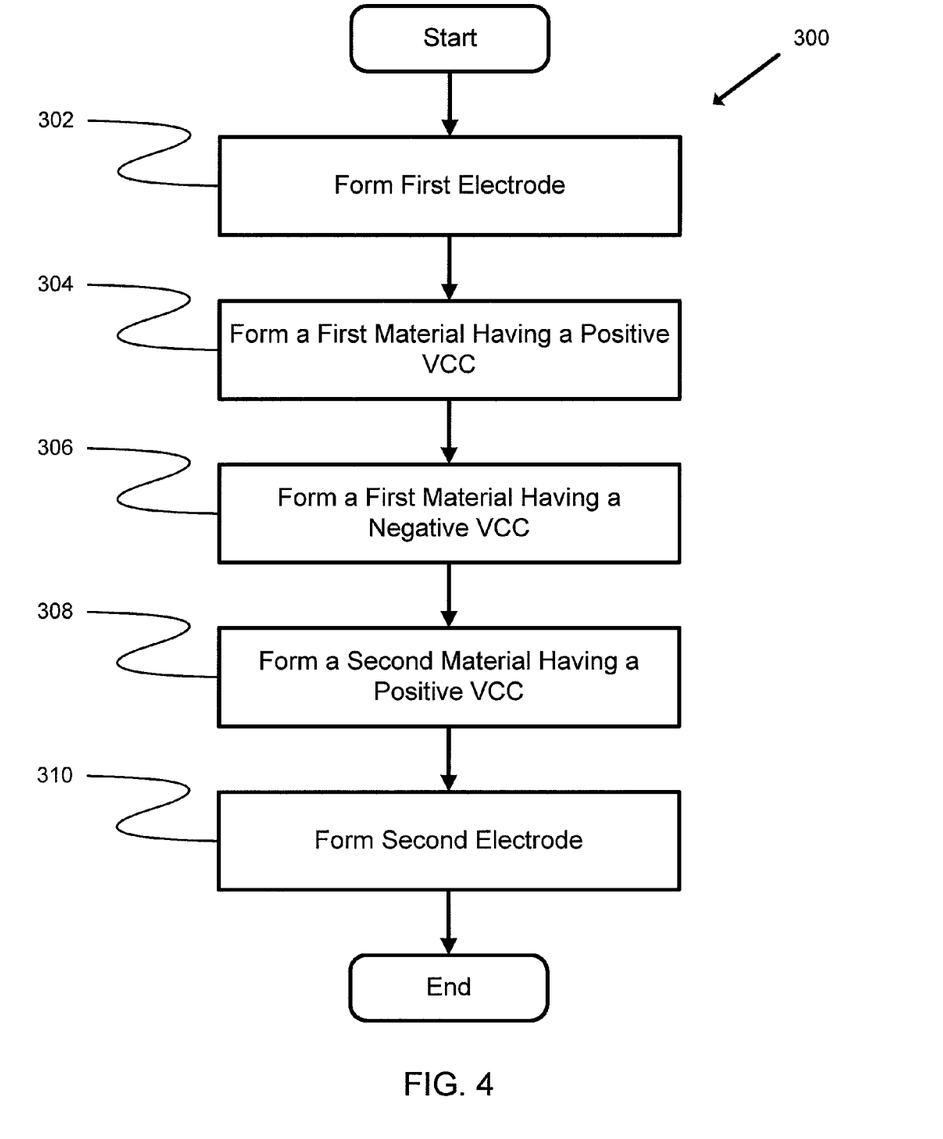
FIG. 4 is a schematic flow chart diagram illustrating one embodiment of a method for manufacturing a capacitor.

FIG. 4 illustrates one embodiment of a method 300 of manufacturing one of the present apparatuses, such as an embodiment of the capacitor 200. The method 300 may include forming 302 a first electrode 202. For example, forming 302 a first electrode 202 may include depositing a metal layer according to a physical vapor deposition (PVD) technique or a chemical vapor deposition (CVD) technique. In some embodiments, the forming 302 a first electrode 202 includes forming a Ti-based metal layer or a Ta-based metal layer.

Additionally, the method 300 may include forming 304 a first insulator layer 204 having a positive VCC adjacent to the first electrode 202, such as first insulator layer 204. In some embodiments, forming 304 a first insulator layer 204 may include forming a high-k layer. In some embodiments, the first insulator layer 204 may be grown or deposited using an atomic layer deposition (ALD) technique, PVD technique, CVD technique, or the like.

Additionally, the method 300 may include forming 306 a second insulator layer 206 having a negative VCC adjacent to the first insulator layer 204, such as second insulator 306. In some embodiments, forming 306 a second insulator layer 206 may include forming a $SiO_2$ layer. In some embodiments, the second insulator layer 206 may be grown or deposited using an ALD technique, PVD technique, CVD technique, or the like.

Additionally, the method 300 may include forming 308 a third insulator layer 208 having a positive VCC adjacent to the second insulator layer 206. In some embodiments, forming 308 a third insulator layer 208 may include forming a high-k layer. In some embodiments, the third insulator layer 208 may be grown or deposited using an ALD technique, PVD technique, CVD technique, or the like.

The method 300 may include forming 310 a second electrode 210. For example, forming 310 a second electrode 210 may include depositing a metal layer according to a PVD technique or a CVD technique. In some embodiments, the forming 310 a second electrode 210 includes forming a Ti-based metal layer or a Ta-based metal layer on the third insulator layer 208.

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. For example, detailed explanations of commonly known microfabrication processes such as PVD and CVD have been excluded for simplification of the description. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept should be apparent to those skilled in the art from this disclosure.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. An Integrated Circuit (IC) device, comprising:
a chip package configured to house an IC;
a plurality of electrical interface pins coupled to the chip package and in communication with the IC, the electrical interface pins configured to conduct electrical signals; and
an IC disposed within the chip package, the IC having at least one capacitor comprising:
a first electrode;
a first insulator layer having a positive quadratic voltage coefficient of capacitance (VCC) adjacent to the first electrode;
a second insulator layer having a negative VCC adjacent to the first insulator layer;
a third insulator layer having a positive VCC adjacent to the second insulator layer; and
a second electrode adjacent to the third insulator layer.

2. The IC device of claim 1, the first insulator layer comprising a high-k material.

3. The IC device of claim 1, the third insulator layer comprising a high-k material.

4. The IC device of claim 1, the second insulator layer comprising silicon dioxide ($SiO_2$).

5. The IC device of claim 1, the first insulator layer and the third insulator layer configured to decrease the effective oxide thickness (EOT) of the capacitor.

6. The IC device of claim 1, the first insulator layer and the third insulator layer configured to reduce the leakage current measured through the first electrode and the second electrode.

7. The IC device of claim 1, the first insulator layer, the second insulator layer, and the third insulator layer configured to reduce the capacitance voltage nonlinearity of the capacitor.

8. The IC device of claim 1, the first electrode layer and the second electrode layer selected from the group consisting TiN, TaN, Ti, Ta, Ru, RuO2, TiSiN, W, WN, Ir, IrO2, Al, and a mixture including two or more these metals.

9. An apparatus comprising:
a first electrode;
a first insulator layer having a positive VCC adjacent to the first electrode;
a second insulator layer having a negative VCC adjacent to the first insulator layer;
a third insulator layer having a positive VCC adjacent to the second insulator layer; and
a second electrode adjacent to the third insulator layer.

10. The apparatus of claim 9, the first insulator layer comprising a high-k material.

11. The apparatus of claim 9, the third insulator layer comprising a high-k material.

12. The apparatus of claim 9, the second insulator layer comprising silicon dioxide ($SiO_2$).

13. The apparatus of claim 9, the first insulator layer and the third insulator layer configured to decrease the effective oxide thickness (EOT) of the apparatus.

14. The apparatus of claim 9, the first insulator layer and the third insulator layer configured to reduce the leakage current measured through the first electrode and the second electrode.

15. The apparatus of claim 9, the first insulator layer, third insulator layer, and the third insulator layer configured to reduce capacitance voltage nonlinearity.

16. The apparatus of claim 9, the first electrode layer and the second electrode layer selected from the group consisting TiN, TaN, Ti, Ta, Ru, RuO2, TiSiN, W, WN, Ir, IrO2, Al, and a mixture including two or more these metals.

17. A method of manufacturing a capacitor, comprising:
    forming a first electrode;
    forming a first insulator layer having a positive VCC adjacent to the first electrode;
    forming a second insulator layer having a negative VCC adjacent to the first insulator layer;
    forming third insulator layer having a positive VCC adjacent to the second insulator layer; and;
    forming a second electrode adjacent to the third insulator layer.

18. The method of claim 17, wherein the forming the first insulator layer comprises forming a high-k material.

19. The method of claim 17, wherein the forming the third insulator layer comprises forming a high-k material.

20. The method of claim 17, wherein the forming the second insulator layer comprises forming a $SiO_2$ layer.

* * * * *

UNITED STATES PATENT AND TRADEMARK OFFICE
CERTIFICATE OF CORRECTION

PATENT NO. : 8,432,020 B2
APPLICATION NO. : 12/794251
DATED : April 30, 2013
INVENTOR(S) : Chanro Park et al.

It is certified that error appears in the above-identified patent and that said Letters Patent is hereby corrected as shown below:

In the Claims:

In claim 8, column 8, line 58, insert --of-- between "more" and "these".

In claim 16, column 10, line 2, insert --of-- between "more" and "these".

In claim 18, column 10, line 13, delete "the forming" and insert --forming-- therefor.

In claim 19, column 10, line 15, delete "the forming" and insert --forming-- therefor.

In claim 20, column 10, line 17, delete "the forming" and insert --forming-- therefor.

Signed and Sealed this
Fourth Day of June, 2013

Teresa Stanek Rea
*Acting Director of the United States Patent and Trademark Office*